United States Patent [19]

Reimer et al.

[11] Patent Number: 4,548,450

[45] Date of Patent: Oct. 22, 1985

[54] TERMINAL PIN SECURING ARRANGEMENT

[75] Inventors: William A. Reimer, Wheaton; David L. Vonder, Addison, both of Ill.

[73] Assignee: GTE Communication Systems Corporation, Northlake, Ill.

[21] Appl. No.: 614,500

[22] Filed: May 29, 1984

[51] Int. Cl.⁴ .............................................. H01R 9/16
[52] U.S. Cl. .......................... 339/17 C; 339/126 RS; 339/217 S
[58] Field of Search ...... 339/220 R, 126 RS, DIG. 3, 339/17 R, 221 R, 221 M, 213 R, 217 R, 217 S, 17 C

[56] References Cited

U.S. PATENT DOCUMENTS

| | | | |
|---|---|---|---|
| 2,976,345 | 3/1961 | Whitted | 339/126 RS |
| 3,337,833 | 8/1967 | Creedon | 339/221 M |
| 3,621,444 | 11/1971 | Stein | 339/221 M |
| 3,880,486 | 4/1975 | Avakian | 339/DIG. 3 |
| 4,036,544 | 7/1977 | Keglewitsch | 339/221 M |

Primary Examiner—Neil Abrams
Attorney, Agent, or Firm—Robert J. Black; Gregory G. Hendricks

[57] ABSTRACT

An arrangement for connecting a terminal pin to a printed wiring board conductor via an electrically conductive elastomeric collar positioned about the terminal pin and pressed into a plated through hole connected to the conductor. Ridges are formed on an outer surface of the collar and a tapered lead-in is provided at one end of the collar to permit engagement with and the formation of contact areas between the collar and the plated through hole. The collar additionally may include a drive shoulder at an end opposite the end containing the tapered lead-in. Projections may be formed on the terminal pin which engage cavities formed in the inner wall of the central bore within the collar to retain the terminal pin within a collar. The collar may be of electrically conductive or electrically non-conductive material.

8 Claims, 3 Drawing Figures

TERMINAL PIN SECURING ARRANGEMENT

BACKGROUND OF THE INVENTION

The present invention relates to terminal pin mountings and, more particularly, to an arrangement for mounting a terminal pin to a printed wiring board while at the same time establishing electrical connection between the terminal pin and a conductor formed on the printed wiring board.

Terminal pin mounting arrangments are very well known to those skilled in the art. One type is taught in U.S. Pat. No. 3,718,750 issued Feb. 27, 1973, to Eugene H. Sayers which teaches an electrical connector having a tin plated female terminal having a body portion adapted to be connected to a printed wiring conductor and an elongated ferrule portion which is C-shaped in cross-section. A male terminal is also included and is of generally cylindrical shape having a knurled shank portion with apices of the individual knurls lying on a circumscribed diameter which is greater than the internal diameter of the C-shaped ferrule portion of the female terminal. The male terminal is connected to the female terminal by intersecting the same into the ferrule portion which causes the C-shaped ferrule portion to radially expand and the knurls on the shank portion to plasticly be formed and cold weld to the female portion to thus electrically connect the two terminal portions. Such an arrangement while operating generally satisfactorily causes damage to both terminal portions, which damage will eventually render electrical connection between the two terminal portions unreliable.

Another method of establishing electrical connection is taught in U.S. Pat. No. 3,870,385 issued Mar. 11, 1975, to Emik Avakian et al. and teaches an interconnection system including resilient conductive elements embedded in a board. The board includes a plurality of ridges with the elements uniformly spaced along the ridges and with the ridges intersected by notches to receive wires, the ends of which are embedded in the resilient conductive elements with the wires positioned between the ridges and below the top surface of the board. Such an arrangement while operating generally satisfactorily will, with repeated insertions of the wires into the conductive elements, cause the conductive elastomer to be pierced by many holes thereby reducing the elastomeric characteristic and the reliability of the electrical connection.

Finally, several methods have been developed for establishing electrical connection to a printed wiring board utilizing a plated through hole formed therein. In this regard, U.S. Pat. No. 4,017,143 issued Apr. 12, 1977, to Robert Gordon Knowles; U.S. Pat. No. 4,066,326 issued Jan. 3, 1978, to Charles Michael Lovendusky; U.S. Pat. No. 4,186,982 issued Feb. 5, 1980, to Robert F. Cobaugh et al.; and U.S. Pat. No. 4,274,699 issued June 23, 1981, to Kenneth J. Keim all teach electrical connection to a printed wiring board conductor through a plated through hole via a terminal of metallic material including a spring line section which section engages in gas-tight relationship the wall of the plate through hole. Such arrangements while operating generally satisfactorily all cause damage to the plated through hole which, with repeated insertions, will render the associated electrical connection unreliable.

SUMMARY OF THE INVENTION

The present invention overcomes the above problems by providing a new and improved arrangement for establishing electrical connection to a printed wiring board utilizing a plated through hole. The terminal pin connecting arrangement in accordance with the present invention connects a terminal pin to a printed wiring board conductor forming an aperture in the printed wiring board intersecting the conductor. An electrically conductive rigid metallic liner is formed within the aperture, the liner fixidly attached to the aperture and electrically connected to the conductor to form a plated through hole. A cylindrical collar of rigid electrically conductive elastomeric material is provided including a central bore which bore is sized to rigidly engage the terminal pin, the terminal pin assembled within the collar central bore, and the collar pressed into the plated through hole to establish electrical connection between the pin and the printed wiring board conductor.

The collar may optionally include a tapered lead-in at one end, a plurality of longitudinal ribs on the outer surface thereof, or a drive shoulder at the other end of the collar. The collar may further include a bore of square cross-section and may be adapted to form a gastight connection with the terminal pin and a liner formed on the wall of the aperture. The terminal pin may be constructed of metal and may include a projection on an outer surface thereof which may engage a corresponding cavity in the wall of the collar's central bore. Finally the collar may be adapted to be the only member undergoing deformation when pressed into the aperture.

BRIEF DESCRIPTION OF THE DRAWING

The various features, advantages and benefits of the terminal pin connecting arrangement of the present invention will be apparent from the following description taken in conjunction with the accompanying drawing in which.

DESCRIPTION OF THE PREFERRED EMBODIMENT

Figure 1:
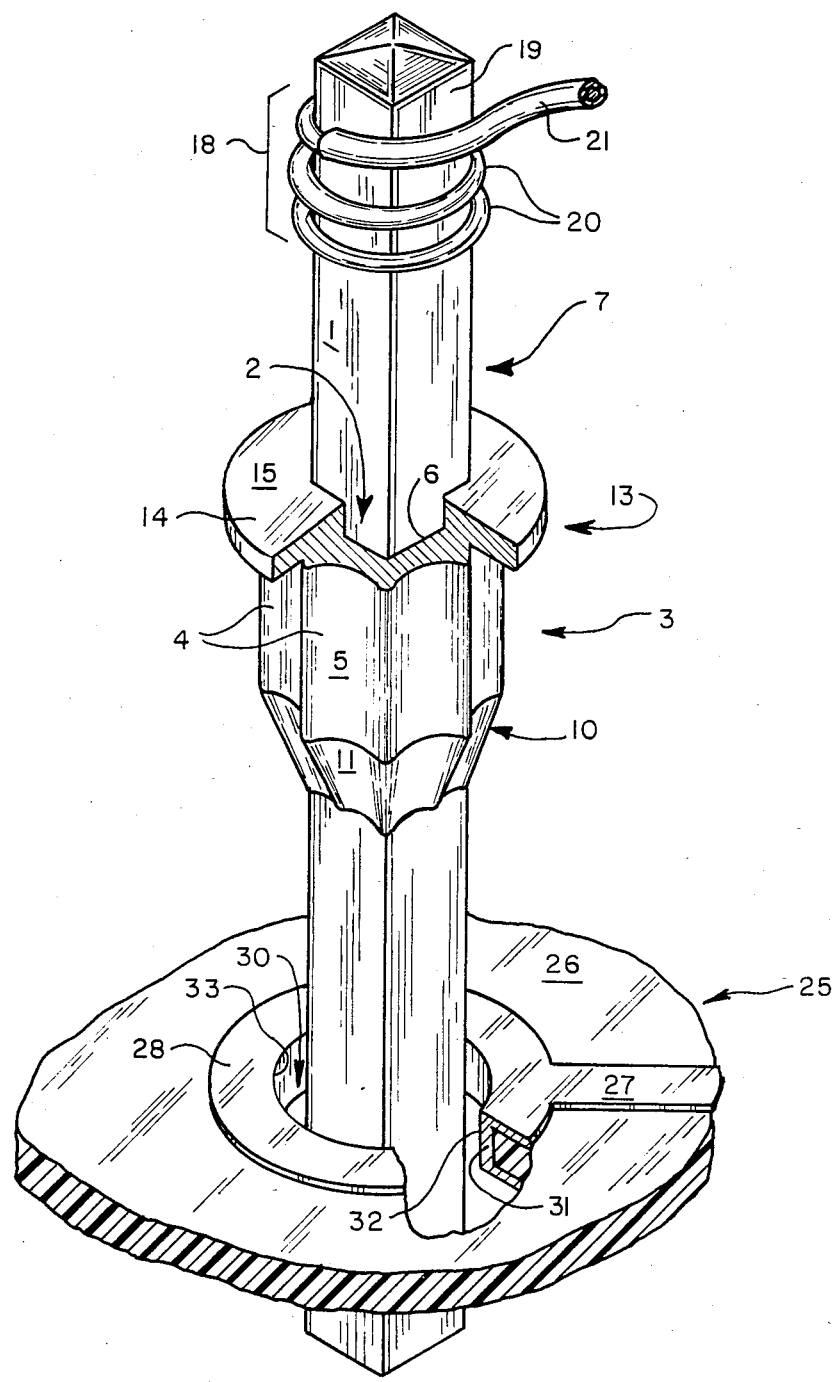
FIG. 1 is a perspective view of the terminal pin connecting arrangement of the present invention prior to assembly of the collar within the plated through hole.

Referring now to FIG. 1, there is shown a terminal pin connecting arrangement in accordance with the present invention including a terminal pin 1 in place within a central bore 2 of a cylindrical collar 3. The cylindrical collar 3 may be circular is cross-section (see FIG. 3) or include a plurality of ridges 4 longitudinally formed on an outer surface 5 of the collar 3. The central bore 2 is sized to rigidly engage the terminal pin 1. The terminal pin 1 and the collar 3 form a pin and collar assembly 7. The collar 3 includes a first end 10 at which end is formed a tapered lead-in 11. The collar 3 also includes at a second end 13, a drive shoulder 14 including an upper surface 15.

The pin 1 may be of rectangular or square cross-section and include a head portion 18 at one end thereof. The head portion 18 may be of any type known to be useful to those skilled in the art. In this regard, the head portion 18 may be in the form of a wire wrap post 19 on which may be wrapped a plurality of turns 20 of a wire 21. Alternate head portions which may be affixed to the terminal pin of the present invention include a connector spring, a power tab and a quick connect spade terminal. The terminal pin 1 may be constructed of an electrically conductive, corrosion resistant material such as phosphor bronze, nickel silver, or beryllium copper.

The collar 3 may be formed from a highly conductive elastomer to permit the passage of electrical current therethrough or, optionally, may be constructed of an insulating elastomer material to electrically isolate the terminal pin 1.

A printed wiring board 25 is included having an upper surface 26 on which is formed a printed wiring conductor 27, a conductive pad 28 connected to the conductor 27, and an aperture 30 formed through the pad 28 and extending from the printed wiring board 25. A metallic liner 31 is formed in the aperture 30 electrically connected to the conductor 27. The liner 31 includes an inner wall 32 and an edge 33.

Figure 2:
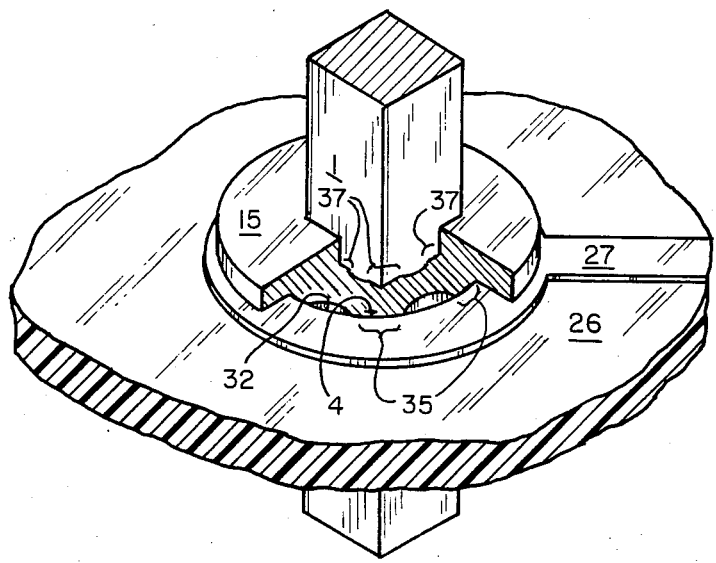
FIG. 2 is a segmented perspective view of the collar inserted within the plated through hole.

Referring now to FIG. 2, there is shown the connecting arrangement of the subject invention assembled within the plated hole. In this regard, the ridges 4 are shown engaged with the inner wall 32 of the liner 31 forming a plurality of outer contact areas 35 between the two elements and a corresponding plurality of inner contacts 37 between the collar 3 and the terminal pin 1.

Figure 3:
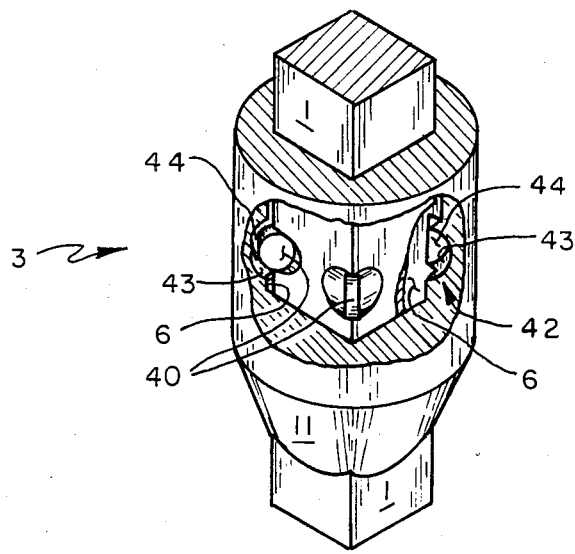
FIG. 3 is a section perspective view of an alternate embodiment of the subject invention.

Referring to FIG. 3 there is shown an alternate embodiment of the collar 3. Shown in this figure is a collar 3 of cylindrical cross-section. Also shown are projections 40 formed in the terminal pin 1 of the present invention. A plurality of cavities 42 are formed in the wall 6 of the central bore 2. The cavities are defined by a circumferential wall 43 between a pair of parallel opposite side walls 44 and may be formed at various locations in the wall 6 of the bore 2. In this regard, the cavities 42 may be formed at the corners of planar walls defining the bore 2. Alternately, the cavities 42 may be formed extending entirely into one planar wall (not shown) of the bore 2.

The present invention is operated by inserting the terminal pin 1 within the central bore 2 of the collar 3 and sliding the pin until the projections 40 engage the drive shoulder 15. The continued application of force on the terminal pin 1 in a direction toward the collar 3 is then used to cause the projections 40 to engage the inner wall 6 of the central bore 2 deflecting the wall outward and permitting the projections 40 to engage the cavities 42 of the wall 6 thus forming the pin and collar assembly 7 of the subject invention.

The assembly 7 is then aligned with the plated through hole 30 and force applied to the drive shoulder 15 in a direction toward the printed wiring board 25 causing the taper 11 located at the first end 10 of the collar 3 to engage the edge 33 of the plated through hole 30. The continued application of force to the drive shoulder 15 is then used to cause the ribs 4 of the collar 3 to deflect radially inward and engage the inner surface 32 of the plated through hole 30 in a series of gas-tight contact areas 35. The radially inward deflection of the ribs 4 will cause corresponding gas-tight contact areas 37 to develop between the inner surface 6 of the central bore 2 and the terminal pin 1. An electrically conductive path may now be traced from the printed wiring conductor 27 to the terminal pin 1 through the conductive pad 28, the liner 31 of the plated through aperture 30, the outer conductive areas 35, the ribs 4, the body 5 of the collar 3, and the inner conductive areas 37 of the central bore 2.

It will be appreciated that since all deflection occurs within the collar 3 of the present invention when it is assembled according to the preferred embodiment, no damage occurs to the wall 32 or the liner 31 of the plated through hole 30. Thus, terminal pin and collar assemblies in accordance with the present invention may be inserted repeatedly, as may be required from time to time, while maintaining gas-tight electrical contact between the various elements and without damage to the aperture 30 or the liner 31.

The terminal pin 1 of the present invention may be disassembled from the printed wiring board 25 by applying force to the pin 1 in a direction away from the printed wiring board 25. The applied force will cause the projections 40 of the terminal pin 1 to deflect the inner wall 6 of the central bore 2 away from the terminal pin 1 thus permitting passage of the projections 40 there passed. The continued application of force will then disengage the terminal pin 1 from the collar 3. Following removal of the terminal pin 1 from the collar 3, the collar 3 may be removed from the plated through hole 30 by applying force to the end 10 of the collar 3 to force the collar out of engagement with the plated hole 30.

Alternatively, a tubular tool (not shown) having an outside diameter slightly smaller than that of the liner 31 and an inside diameter slightly larger than the widest dimension of the terminal pin 1 may be slid over the lower end of the terminal pin 1 to engage the lead-in area 11 of the collar 3. Following engagement of the tubular member with the lead-in area 11, force may then be applied to the tubular member to urge the collar 3 out of engagement with the plated through hole 30 while not affecting the relationship between the terminal pin 1 and the collar 3.

Although the preferred embodiments of the invention have been illustrated, and those forms described in detail, it will be readily apparent to those skilled in the art that various modifications may be made therein without departing from the spirit of the invention or from the scope of the appended claims.

What is claimed is:

1. An arrangement for securing a terminal pin to a printed wiring board comprising:
   a printed wiring board;
   an aperture formed in said printed wiring board;
   a terminal pin of square cross-section;
   a cylindrical collar of elastomeric material including a plurality of planar walls defining a central bore and an outer surface, said bore sized to rigidly engage said terminal pin, and said collar outer surface sized to tightly engage said aperture;
   a plurality of cavities each defined by a circumferential wall between a pair of parallel opposite side walls and each formed at a corner defined by the intersection of a different adjacent pair of said planar walls;
   a plurality of projections formed on said terminal pin and positioned to engage said cavities, said terminal pin assembled within said central bore with said projections engaged with said corresponding cavities, and said collar and terminal pin assembly pressed into said aperture to compress said collar between said aperture and said terminal pin to thereby secure said pin to said board.

2. An arrangement as claimed in claim 1, wherein: said cylindrical collar includes a first end, said first end tapered to facilitate inserting said collar within said aperture.

3. An arrangement as claimed in claim 1, wherein: said outer surface includes a plurality of ribs, said ribs deformed radially inward when said collar is pressed into said aperture.

4. An arrangement as claimed in claim 1, wherein: said collar includes an enlarged shoulder at one end thereof, said shoulder adapted to receive a force exerted on said collar to press said collar and terminal pin assembly into said aperture.

5. An arrangement as claimed in claim 1, wherein: said terminal pin is constructed of an electrically conductive corrosion resistant metal.

6. An arrangement as claimed in claim 1, wherein: said elastomeric material forms a gas-tight connection between itself and said terminal pin.

7. An arrangement as claimed in claim 1, wherein: said aperture includes a metallic liner and said elastomer is conductive and forms a gas-tight connection between itself and said liner.

8. An arrangement as claimed in claim 1, wherein: when said terminal pin and collar assembly is pressed into said aperture, deformation occurs solely within said collar.

* * * * *